United States Patent
Sanchez et al.

(10) Patent No.: US 11,658,672 B2
(45) Date of Patent: May 23, 2023

(54) METHOD AND SYSTEM FOR DIGITAL PRE-DISTORTION USING LOOK-UP TABLE

(71) Applicant: Intel Corporation, Santa Clara, CA (US)

(72) Inventors: Ramon Sanchez, Galapagar (ES); Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/455,223

(22) Filed: Nov. 17, 2021

(65) Prior Publication Data
US 2022/0200618 A1    Jun. 23, 2022

(30) Foreign Application Priority Data

Dec. 23, 2020   (EP) ................................. 20216865

(51) Int. Cl.
*H03M 1/10*   (2006.01)

(52) U.S. Cl.
CPC ....... *H03M 1/1052* (2013.01); *H03M 1/1061* (2013.01)

(58) Field of Classification Search
CPC . H03M 1/1052; H03M 1/1061; H03F 1/3247; H03F 1/3258
See application file for complete search history.

(56) References Cited

U.S. PATENT DOCUMENTS

| 8,787,494 | B2* | 7/2014 | Bai ....................... H03F 1/3247 341/20 |
| 9,225,501 | B2* | 12/2015 | Azadet .................. H04L 5/1461 |
| 9,923,595 | B2 | 3/2018 | Molina et al. |
| 11,356,066 | B1* | 6/2022 | Zhao ..................... H03F 1/3294 |
| 2014/0314176 | A1* | 10/2014 | Azadet ............. H04L 25/03343 703/2 |

(Continued)

FOREIGN PATENT DOCUMENTS

| CN | 111510081 A | 8/2020 |
| EP | 3166223 A2 | 5/2017 |

OTHER PUBLICATIONS

Albert Molina, Kannan Rajamani, and Kamran Azadet, Senior Member, IEEE—IEEE Transactions on Microwave Theory and Techniques, vol. 65, No. 4, Apr. 2017 "Concurrent Dual-Band Digital Predistortion Using 2-D Lookup Tables With Bilinear Interpolation and Extrapolation: Direct Least Squares Coefficient Adaptation".

(Continued)

*Primary Examiner* — Lam T Mai
(74) *Attorney, Agent, or Firm* — 2SPL Patentanwälte PartG mbB; Yong Beom Hwang (57) ABSTRACT

A digital predistortion system and method for pre-distorting an input to a non-linear system. The digital predistortion system includes a digital predistortion circuit and a memory. The digital predistortion circuit is configured to receive input data and modify the input data using at least one look-up table. The at least one look-up table is addressed by a signed real value of the input data. The memory is configured to store the at least one look-up table. The at least one look-up table is implemented based on a generalized memory polynomial model.

15 Claims, 9 Drawing Sheets

(56) References Cited

U.S. PATENT DOCUMENTS

| | | | | |
|---|---|---|---|---|
| 2014/0314181 | A1* | 10/2014 | Azadet | H04L 25/08 |
| | | | | 703/2 |
| 2014/0316752 | A1* | 10/2014 | Azadet | H04L 27/368 |
| | | | | 703/2 |
| 2016/0308577 | A1* | 10/2016 | Molina | H04L 27/368 |
| 2017/0338841 | A1* | 11/2017 | Pratt | H04B 1/0475 |
| 2018/0013456 | A1 | 1/2018 | Miyazaki et al. | |
| 2018/0331662 | A1* | 11/2018 | Maa | H03F 1/30 |
| 2019/0312649 | A1* | 10/2019 | Spyropoulos | H04B 1/0475 |
| 2022/0190851 | A1* | 6/2022 | Pawliuk | H04L 27/367 |
| 2022/0216834 | A1* | 7/2022 | Myoung | H04B 1/0475 |

OTHER PUBLICATIONS

Albert Molina, Kannan Rajamani, and Kamran Azadet, Senior Member, IEEE—IEEE Transactions on Microwave Theory and Techniques, vol. 65, No. 3, Mar. 2017 "Digital Predistortion Using Lookup Tables With Linear Interpolation and Extrapolation: Direct Least Squares Coefficient Adaptation".

* cited by examiner

METHOD AND SYSTEM FOR DIGITAL PRE-DISTORTION USING LOOK-UP TABLE

FIELD

Examples relate to digital pre-distortion (DPD), more particularly a method and system for RF sampling digital predistortion using asymmetric look-up tables.

BACKGROUND

Digital pre-distortion is a technique used to linearize a power amplifier or other non-linear devices in a transmitter to improve the efficiency of the non-linear devices. A digital pre-distortion circuit inversely models the gain and phase characteristics of the power amplifier and, when combined with the amplifier or other non-linear devices, produces an overall system that is more linear and reduces distortion than would otherwise be caused by the power amplifier or other non-linear devices. An inverse distortion is introduced into the input of the non-linear devices, thereby reducing any non-linearity that the non-linear devices might otherwise exhibit.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Examples are disclosed for a method and system for linearizing a non-linear system over a wide bandwidth (e.g., 0 to 6 GHz) for multi-band or ultra-wide-band applications. Conventional DPD solutions operate at lower sampling rates and linearize a transmitter in a specific band. However, such conventional DPD solutions only address a relatively narrow bandwidth. The examples disclosed herein provide a generalization of the conventional DPD solutions for application to a very wideband signal. In the examples disclosed herein, look-up tables used for the DPD are addressed by the signed real value of the input samples, instead of the magnitude of the input samples. The examples disclosed herein enable the correction of even orders as well as odd orders of non-linearities.

Figure 1:
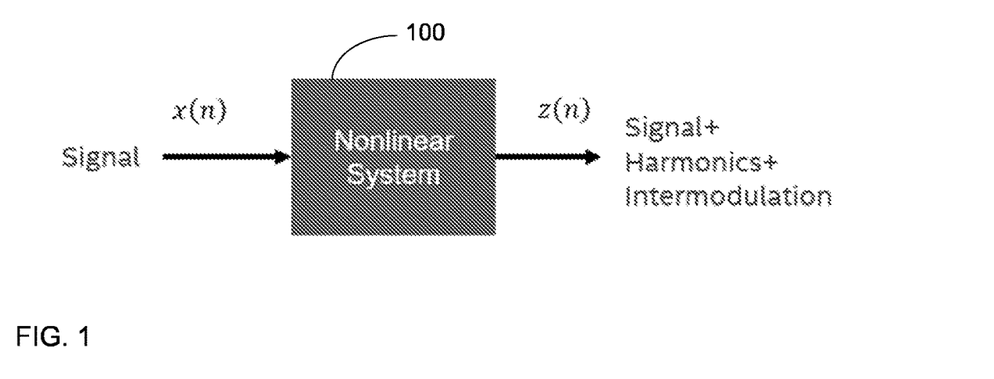
FIG. 1 shows a non-linear system.

FIG. 1 shows a non-linear system 100. The non-linear system 100 in a transmit chain such as a digital-to-analog converter (DAC), a power amplifier, etc. introduces a non-linear distortion that results in a presence of signal harmonics and inter-modulation products at the output of the non-linear system 100. The non-linear system 100 receives an input signal x(n) and generate an output signal z(n). Due to the non-linear effects of the non-linear system 100, non-linear distortions such as harmonics and intermodulation may be present at the output signal z(n).

Figure 2:
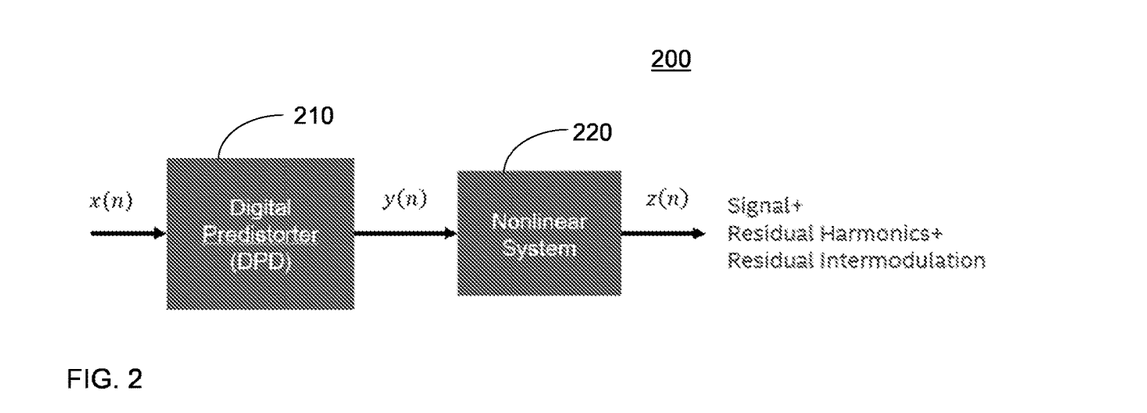
FIG. 2 shows an example system including a DPD system in front of a non-linear system for linearizing the non-linear system, in which aspects of the present application may be implemented.

FIG. 2 shows an example system 200 including a DPD system 210 in front of a non-linear system 220 for linearizing the non-linear system 220, in which aspects of the present application may be implemented. The non-linear system 220 includes a DAC, a power amplifier, or any other device having non-linear characteristics. In order to eliminate the unwanted distortion (such as harmonics and inter-modulation) at the output of the non-linear system 220, a DPD system 210 is provided in front of the non-linear system 220. The DPD system 210 receives an input signal x(n) and modifies the input signal to generate an output signal y(n). The DPD system 210 may implement a mathematical model that produces an approximation of the inverse function of the non-linear system 220. By predistorting the input signal to the non-linear system 220 the non-linear effects of the non-linear system 220 can be compensated and the output of the non-linear system 220 may be linearized.

The pre-distortion, however, is usually not perfect and some residual harmonics and intermodulation products may be present at the output of the non-linear system 220. The terms (e.g., polynomial terms) of the mathematical model for the DPD typically resemble that of the non-linearity with different parameters. Conventional DPD schemes do not attempt to cancel the even order terms of the non-linearity for several reasons. For example, even order harmonics of the non-linear system typically fall out of band in narrow-band systems. Differential architectures of the system can naturally remove the even order terms to a large extent.

The non-linear system 220 (such as a power amplifier, a DAC, etc.) may be modeled using polynomials or piece-wise polynomial functions to characterize the non-linear response of the system. Polynomial-based DPD systems receive input samples and applies the polynomial functions of the model to the input samples to generate pre-distorted DPD outputs. More specifically, the polynomial DPD systems may evaluate each of a set of polynomials given one or more input samples, apply the polynomial outputs as a gain factor to a function of the input samples, and sum the resulting samples to generate the DPD output. Assuming a suitable selection of modeling polynomials, the pre-distorted outputs may represent the inverse of the actual non-linearities of the non-linear system, which may be substantially canceled when the DPD outputs are applied as input to the non-linear system.

Polynomial-based DPD systems may either depend only on the current input sample (i.e., a memoryless polynomial model) or may depend the current input sample in addition to one or more past input samples (i.e., a polynomial model with memory). The polynomial models with memory may present the DPD model as the sum of a plurality of terms, where each term is the product of a function of the current and/or previous input samples and a polynomial that is a function of the magnitude of the current or previous input samples. Accordingly, a DPD polynomial model with memory may evaluate each of a set of polynomials at one or more input samples, apply each polynomial output as a gain factor to a function of one or more input samples, and sum the resulting products to produce the overall DPD output.

A DPD polynomial model may need to evaluate each of the set of polynomials in order to produce each DPD output sample. In order to reduce computational burden, polynomial DPD systems may utilize one or more look-up tables (LUTs) to generate the DPD outputs. As opposed to directly evaluating each polynomial, DPD LUT systems may evaluate each of the polynomials over a wide range of input samples and store the resulting outputs in a separate LUT, thus producing a separate LUT to represent each polynomial. DPD LUT systems may evaluate each LUT according to the received input samples and produce an LUT output value for each LUT. DPD LUT systems may then produce the DPD output by applying the LUT output values as a set of gains to the corresponding function of input samples, thus avoiding direct evaluation of each polynomial.

The DPD system 210 may utilize adaptable LUTs that dynamically adjust the LUT coefficients for each LUT based on feedback from the output of the non-linear system 220. A DPD adaptation circuit (not shown) may perform adaptation of the LUT coefficients utilizing the feedback information derived from the output of the non-linear system 220. The DPD adaptation circuit may be a part of the DPD system 210. The DPD adaptation circuit may attempt to correct for any inaccuracies in the LUT coefficients that are observable through non-linearities detected in the output of the non-linear system 220. The DPD adaptation circuit may employ an adaptation scheme such as Least Squares (LS) based on either indirect or direct learning to adapt the LUT coefficients of the DPD system 210. Therefore, the DPD system 210 may dynamically adapt the LUT coefficients over time based on observations of the output of the non-linear system 220.

Figure 3:
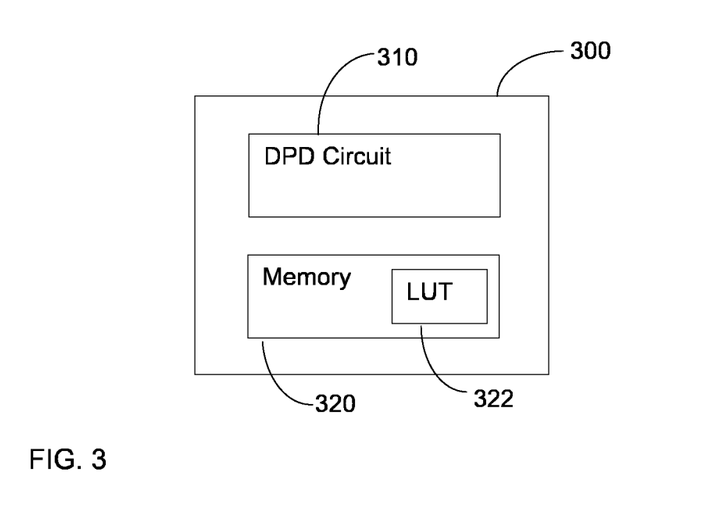
FIG. 3 is a block diagram of an example DPD system for pre-distorting an input to a non-linear system.

FIG. 3 is a block diagram of a DPD system 300 for pre-distorting an input to a non-linear system. The DPD system 300 may be included in a transmitter, which may be included in a base station or a user equipment. The DPD system 300 includes a DPD circuit 310 and a memory 320. The DPD circuit 310 is configured to receive input data (a sequence of input samples) and modify the input data using at least one LUT stored in the memory 320. The DPD circuit 310 may apply predistortion to the input data in order to compensate for the non-linearities in the non-linear system. The DPD circuit 310 may utilize one or more LUTs 322. Each LUT 322 may depend on the current input sample and/or a past input sample. In one example, the LUT 322 may be implemented based on a generalized memory polynomial (GMP) model. The DPD circuit 310 receives input data, identifies corresponding LUT coefficients for each LUT, and generates output data (a sequence of output samples) according to the relevant LUT coefficients of the LUT(s). The modified input data is sent to the non-linear system. In accordance with examples disclosed herein, the LUT(s) 322 is addressed by a signed real value of the input samples (e.g., from −1 to +1). In examples, the LUT(s) are asymmetric since the LUT outputs may be different for negative and positive input values of the input samples in contrast to a symmetric LUT that is addressed with an absolute value of the input samples.

For implementing DPD with memory, the DPD circuit 310 may realize one or more LUTs according to a memory depth, where each of the LUTs produces an LUT output based on current and past input samples. The DPD circuit 310 may then produce the DPD output by applying each LUT output as a gain to the corresponding LUT function of input samples and summing the resulting products to obtain the DPD output. For a one-dimensional LUT case, the DPD circuit 310 may receive a sequence of input samples and address the LUT with the signed real value of the input sample to produce an LUT output. The DPD circuit 310 may then apply each LUT output as a gain factor to the corresponding function of the input samples and sum the resulting samples to obtain the DPD output.

Each one-dimensional LUT may be defined as a sequence of evenly-spaced LUT coefficients positioned along a one-dimensional axis at multiples of an LUT spacing. The DPD circuit 310 may determine each LUT output by mapping the input samples to the evenly-spaced grid of LUT coefficients and applying one or more proximate LUT coefficients to generate the LUT output. Each LUT coefficient may be a real number, and the DPD circuit 310 may produce a DPD output sample from each input sample.

As each LUT coefficient is located at a discrete point on the one-dimensional axis of the corresponding LUT, the (real-valued) input sample may not fall exactly at an LUT coefficient. Accordingly, the DPD circuit 310 may apply linear interpolation or extrapolation to calculate the LUT outputs.

Figure 4:
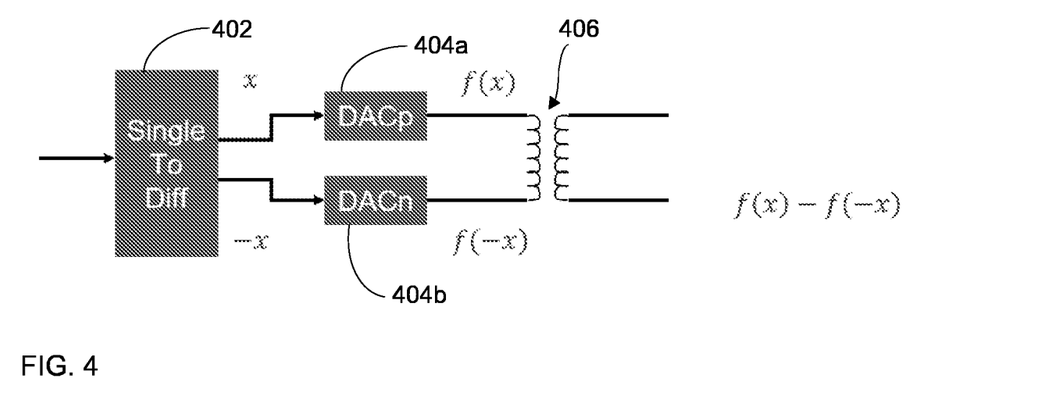
FIG. 4 shows an example RF sampling DAC, in which aspects of the present application may be implemented.

FIG. 4 shows an example RF sampling DAC, in which aspects of the present application may be implemented. In FIG. 4, the single-ended input data (x) is converted to a differential form (x, −x) by a converter circuit 402 and supplied to a pair of DACs 404a, 404b (DACp and DACn), respectively. The pair of DACs 404a, 404b generate an output of f(x) and f(−x), respectively, which are output via a transformer 406.

Without mispatch between the two branches in a static (memoryless) system, the output can be written as follows:

$$f(x) - f(-x) = \sum_{k=0}^{\infty} a_k x^k - \sum_{k=0}^{\infty} a_k (-1)^k x^k = \sum_{k=0}^{\infty} a_{2k+1} x^{2k+1} = (\sum_{k=0}^{\infty} a_{2k+1} x^{2k}) \cdot x = g(x^2) \cdot x. \quad \text{Equation (1)}$$

In Equation (1), all even terms are cancelled. Equation (1) may be implemented with an LUT, for example as LUT(|x|)*x. In this case, the polynomial models for the DPD will only consider the absolute value of the input signal.

In one example, the DPD may be implemented based on a generalized memory polynomial (GMP) model. As an alternative, a different model may be used such as a memory polynomial model, an envelope memory polynomial model, an orthogonal memory polynomial model, a hybrid memory polynomial model, a dynamic deviation reduction (DDR) model, etc. A GMP model is a simplified form of the more general but complex Volterra series. A GMP model models an actual physical system such as a reverse power amplifier response (i.e., output to input response). A GMP model may be written as follows:

$$y(n) = \sum_{l=0}^{L-1} \sum_{m=0}^{M-1} \sum_{k=0}^{K-1} a_{lkm} x(n-l) |x(n-l-m)|^k, \quad \text{Equation (2)}$$

where x(n) is an input, y(n) is an output, L is a memory depth, M is a cross-term, K is a non-linearity order, and $a_{lkm}$ is the model's coefficients.

As stated above, DPD may be implemented using one or more look-up tables. The look-up tables may be obtained by first computing the coefficients of each of the GMP polynomials using conventional techniques (e.g., a least square approach) and then sampling each of the polynomials to create the look-up tables for each polynomial. The look-up tables approximate the GMP polynomial model, which is itself an approximation of an ideal infinite tap Volterra-based pre-distorter. If DPD is implemented using look-up tables, Equation (2) can be written as:

$$y(n) = \sum_{l=0}^{L-1} x(n-l) \sum_{m=0}^{M-1} \sum_{k=0}^{K-1} a_{lkm} |x(n-l-m)|^k. \quad \text{Equation (3)}$$

Equation (3) can be rewritten as:

$$y(n) = \sum_{l=0}^{L-1} x(n-l) \sum_{m=0}^{M-1} P_{l,m}(|x(n-l-m)|), \quad \text{Equation (4)}$$

where $P_{l,m}(|x(n-l-m)|) = \sum_{k=0}^{K-1} a_{lkm} |x(n-l-m)|^k$. $P_{l,m}$ may be implemented as LUTs. In this case, the argument is always a positive real number. $P_{l,m}$ may be estimated directly (direct LUT estimation) or indirectly.

The conventional DPD, however, does not work well for linearizing the transmitter over extremely wide bandwidth (e.g., 0 to 6 GHz) for multi-band and or ultra-wide-band applications. If there are significant mismatches in differential branches of the non-linear system, the even order terms will not be cancelled. For example, in the example static (memoryless) nonlinear system shown in FIG. 4, the output with mismatch between the branches may be written as:

$$f_p(x) - f_n(-x) = \sum_{k=0}^{\infty} a_{p,k} x^k - \sum_{k=0}^{\infty} a_{n,k} (-1)^k x^k = \sum_{k=0}^{\infty} b_k x^k = h(x) \cdot x. \quad \text{Equation (5)}$$

In Equation (5), the even order terms are not canceled.

In accordance with examples disclosed herein, the LUTs for the DPD are addressed by the signed real value of the (RF) input samples. For example, instead of Equation (4), Equation (6) below may be used.

$$y(n) = \sum_{l=0}^{L-1} x(n-l) \sum_{m=0}^{M-1} P_{l,m}(x(n-l-m)), \quad \text{Equation (6)}$$

where $P_{l,m}(x(n-l-m)) = \sum_{k=0}^{K-1} a_{lkm} (x(n-l-m))^k$. x(n) is an input, y(n) is an output, L is a memory depth, M is a cross-term, K is a non-linearity order, and $a_{lkm}$ is the model's coefficients. In Equation (6), $P_{l,m}$ may be implemented as an LUT(s) and the argument of the $P_{l,m}$ LUTs are signed real values of x(n−l−m).

The contents of the LUT (e.g., $P_{l,m}$ in Equation (6)) may be indirectly calculated. For example, by applying inputs to the non-linear system 220 and measuring the outputs from the non-linear system 220, the parameters of the DPD model can be optimized by finding the best fit to the inverse of the input-output relationship. The coefficients $a_{lkm}$ of a polynomial model are calculated and then, by evaluating the polynomial function at uniformly spaced magnitude values, the contents of the LUT can be calculated. In examples disclosed herein, the LUT input is a real value instead of an absolute value as in Equation (4). This scheme can deal with the even order harmonics.

Alternatively, the contents of the LUT (e.g., $P_{l,m}$ in Equation (6)) may be directly calculated. Instead of adapting the coefficients of a polynomial model and then evaluating the polynomial function at uniformly spaced magnitude values and storing these values in an LUT, the LUT coefficients are adapted directly using, for example, the Least Mean Square (LMS) algorithm with interpolation and extrapolation. Linear interpolation and extrapolation basis functions are used to express the DPD system as a system of linear-in-parameter equations that can be optimized using LMS. One example of the direct calculation of an LUT is disclosed in paper "Digital Predistortion Using Lookup Tables With Linear Interpolation and Extrapolation: Direct Least Squares Coefficient Adaptation," IEEE Transactions on Microwave Theory and Techniques, Vol. 65, No. 3, March 2017, which is incorporated herein by reference. Another example of the direct calculation of an LUT is disclosed in U.S. Pat. No. 9,225,501, which is incorporated herein by reference.

Figure 5:
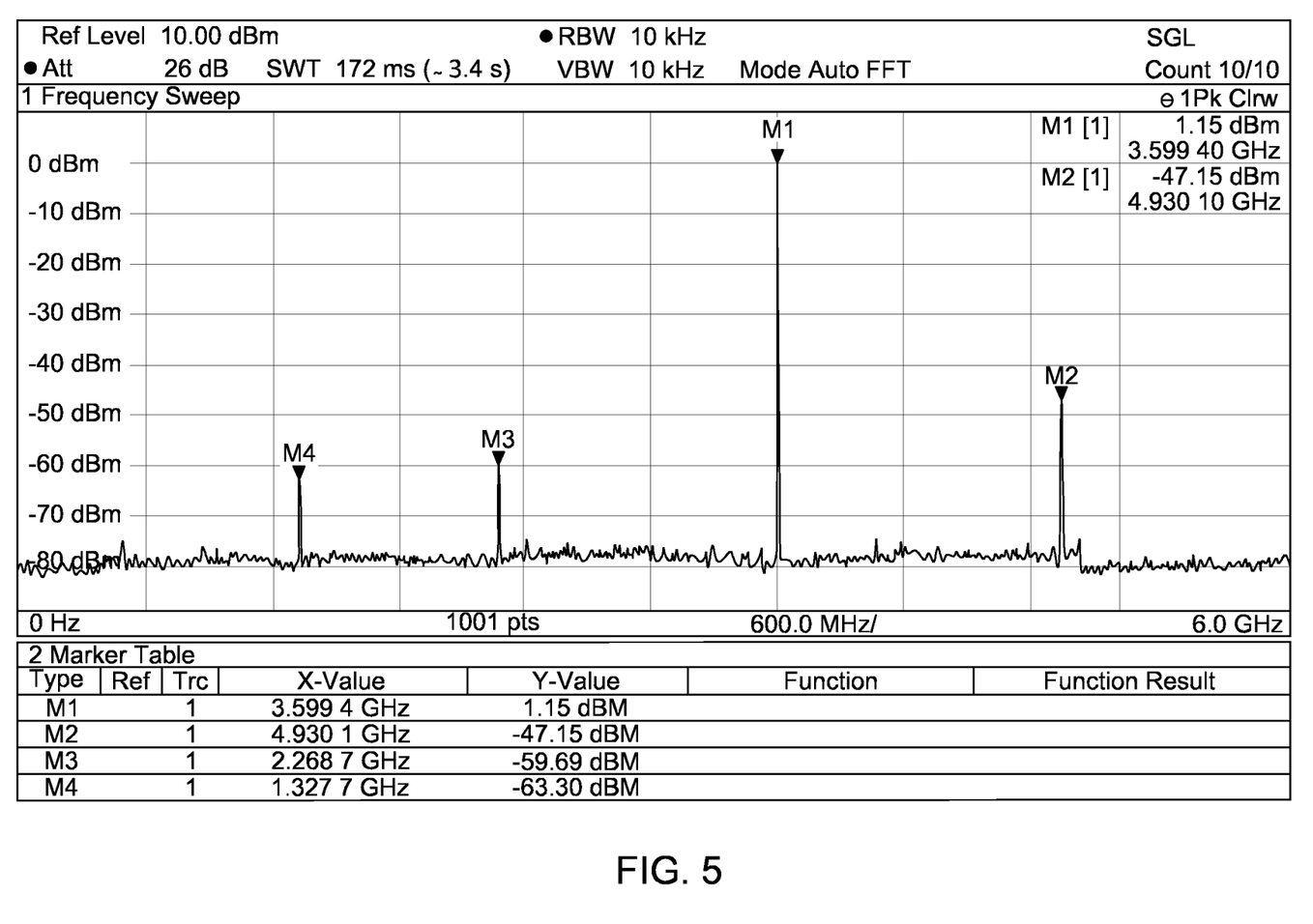
FIGS. 5-7 show test results with no DPD, with DPD with symmetric LUT, and with DPD with asymmetric LUT in accordance with examples disclosed herein, respectively.
Figure 6:
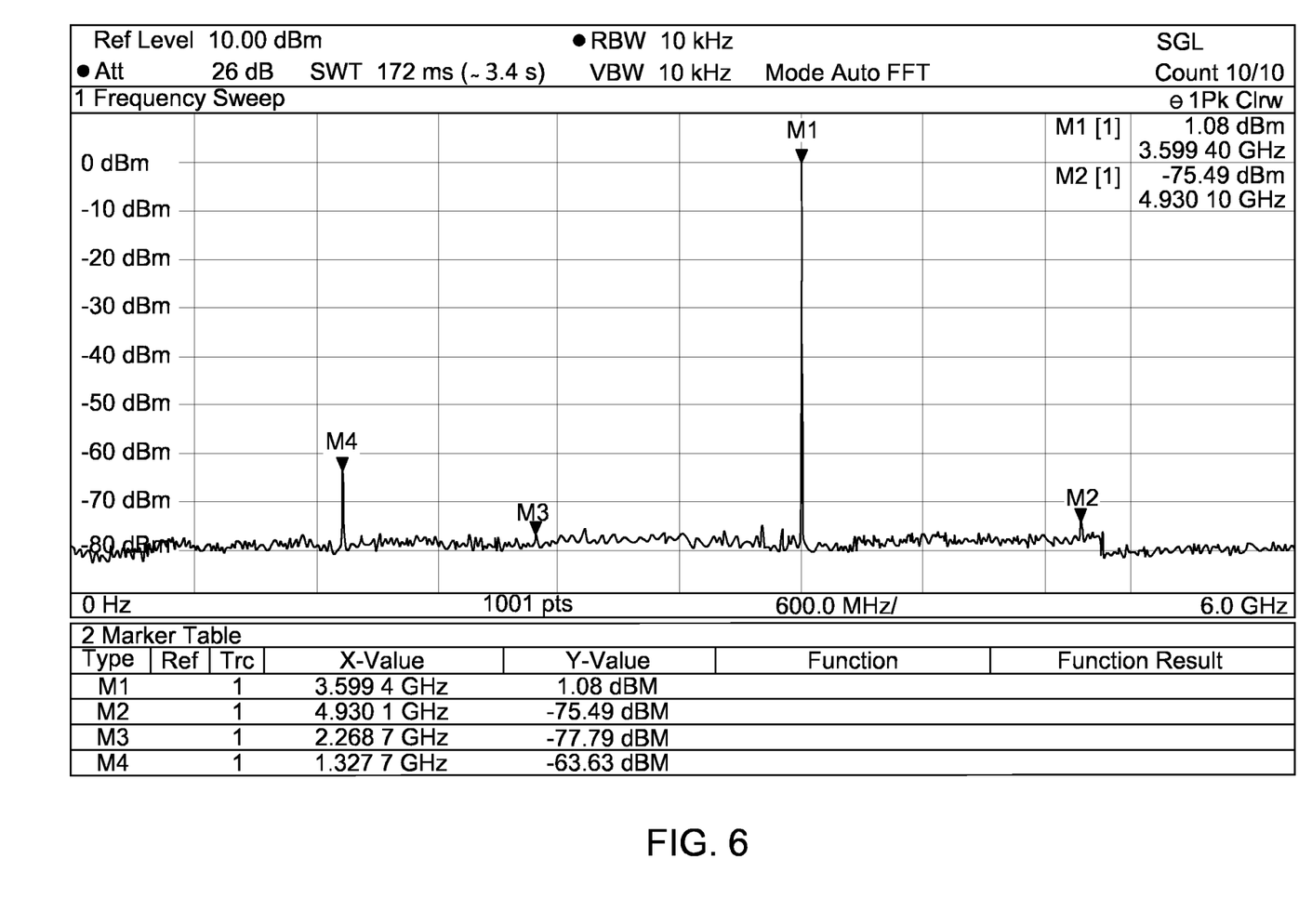
Figure 7:
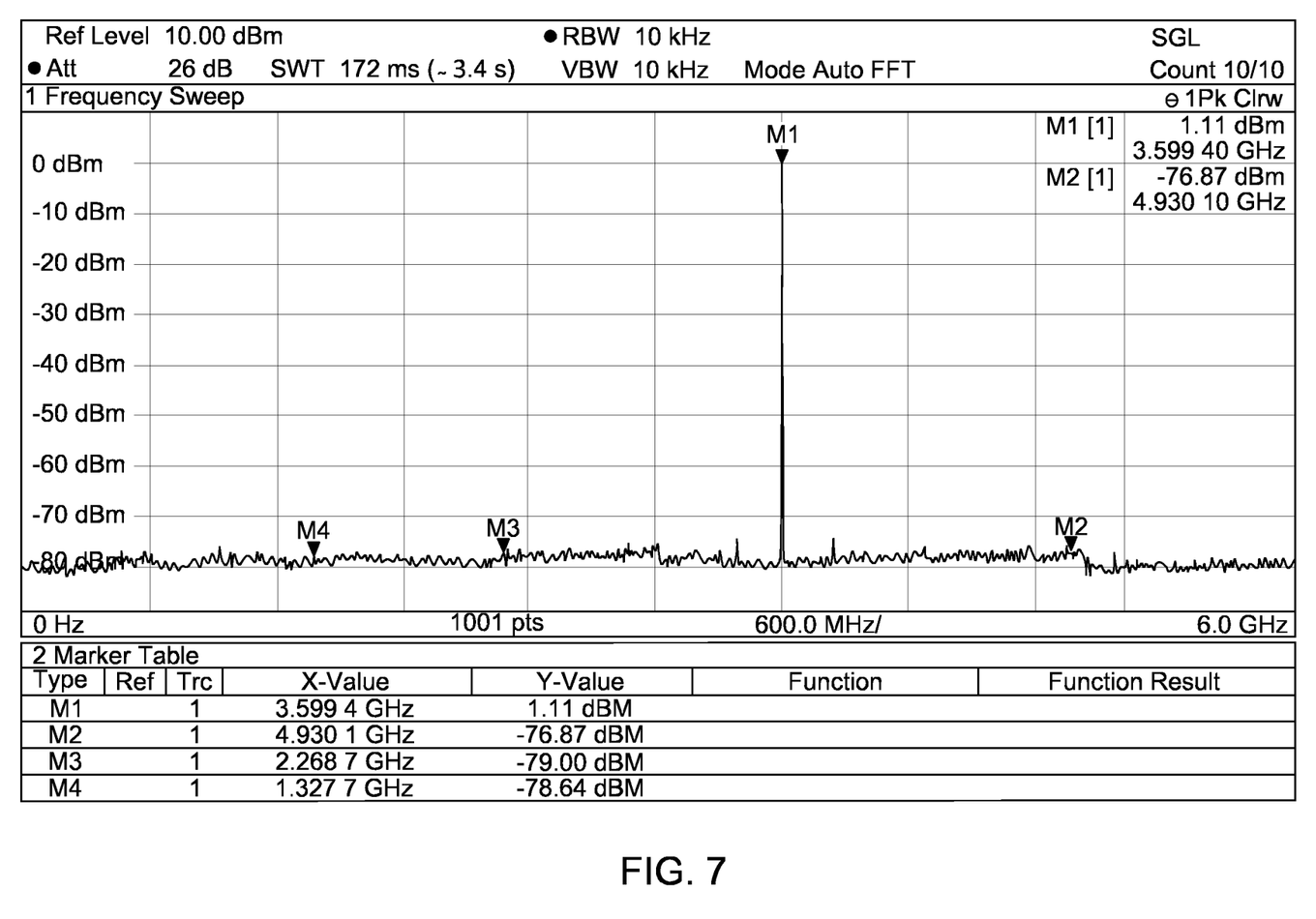

FIGS. 5-7 show simulation results without DPD, with symmetric LUT DPD, and asymmetric LUT DPD in accordance with the example disclose herein, respectively. FIG. 5 shows spurious-free dynamic range (SFDR) of 47 dBc, FIG. 6 shows an SFDR of 64 dBc, and FIG. 7 shows an SFDR of 77 dBc. FIGS. 5-7 show that the even-order harmonics are only removed by the asymmetric LUT DPD. In FIGS. 5-7, M1 is a signal (single tone), M2 and M3 are odd order (third and fifth order harmonics), M4 is even order (fourth order harmonic) aliased into the Tx band (DAC sampling rate is 15.729 GHz).

Figure 8:
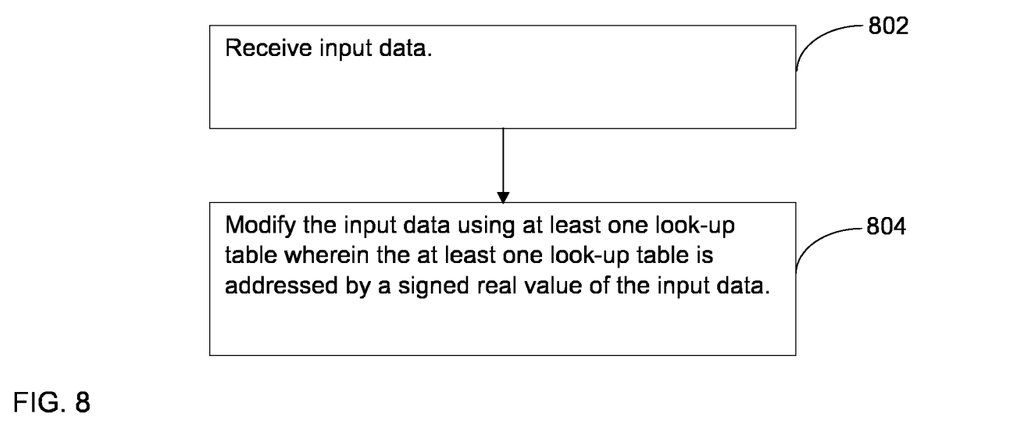
FIG. 8 is a flow diagram of an example process for pre-distorting an input to a non-linear system.

FIG. 8 is a flow diagram of a process for pre-distorting an input to a non-linear system. The method includes receiving (802) input data. The method further includes modifying (804) the input data using at least one look-up table. The at least one look-up table is addressed by a signed real value of the input data. The non-linear system may include a power amplifier, and/or a digital-to-analog converter.

Figure 9:
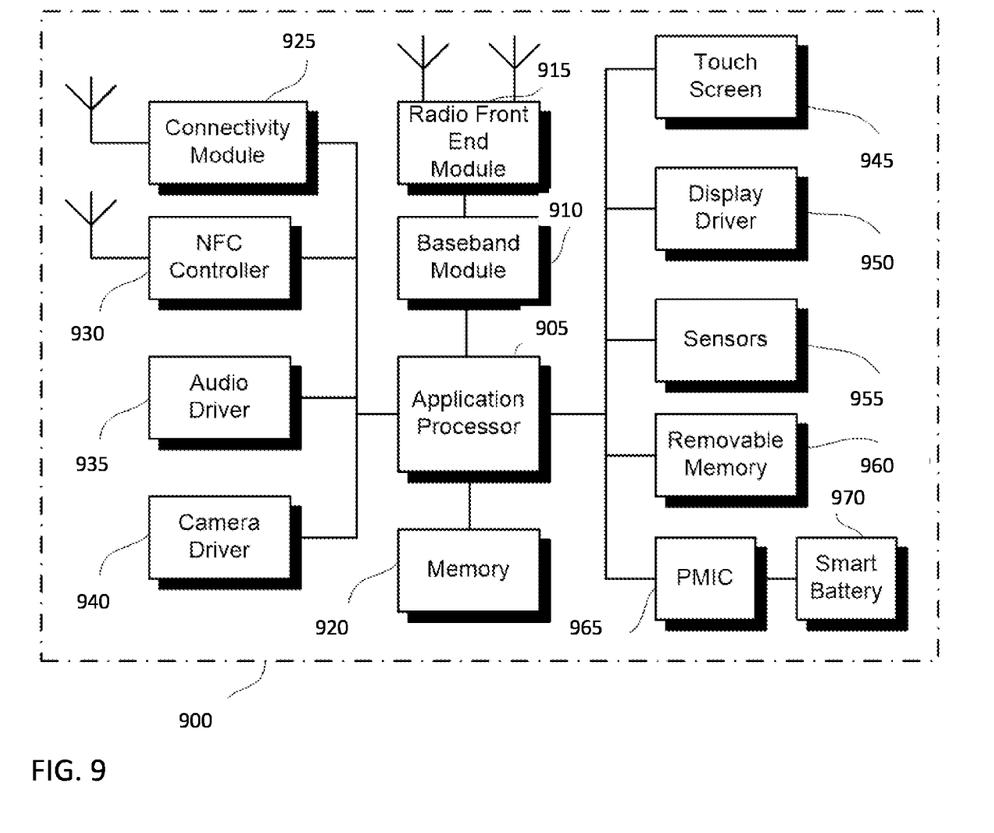
FIG. 9 illustrates a user device in which the examples disclosed herein may be implemented.

FIG. 9 illustrates a user device 900 in which the examples disclosed herein may be implemented. For example, the examples disclosed herein may be implemented in the radio front-end module 915, in the baseband module 910, etc. The user device 900 may be a mobile device in some aspects and includes an application processor 905, baseband processor 910 (also referred to as a baseband module), radio front end module (RFEM) 915, memory 920, connectivity module 925, near field communication (NFC) controller 930, audio driver 935, camera driver 940, touch screen 945, display driver 950, sensors 955, removable memory 960, power management integrated circuit (PMIC) 965 and smart battery 970.

In some aspects, application processor 905 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (10), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 910 may be implemented, for example, as a solder-down substrate including one or more integrated circuits, a single packaged integrated circuit soldered to a main circuit board, and/or a multi-chip module containing two or more integrated circuits.

Figure 10:
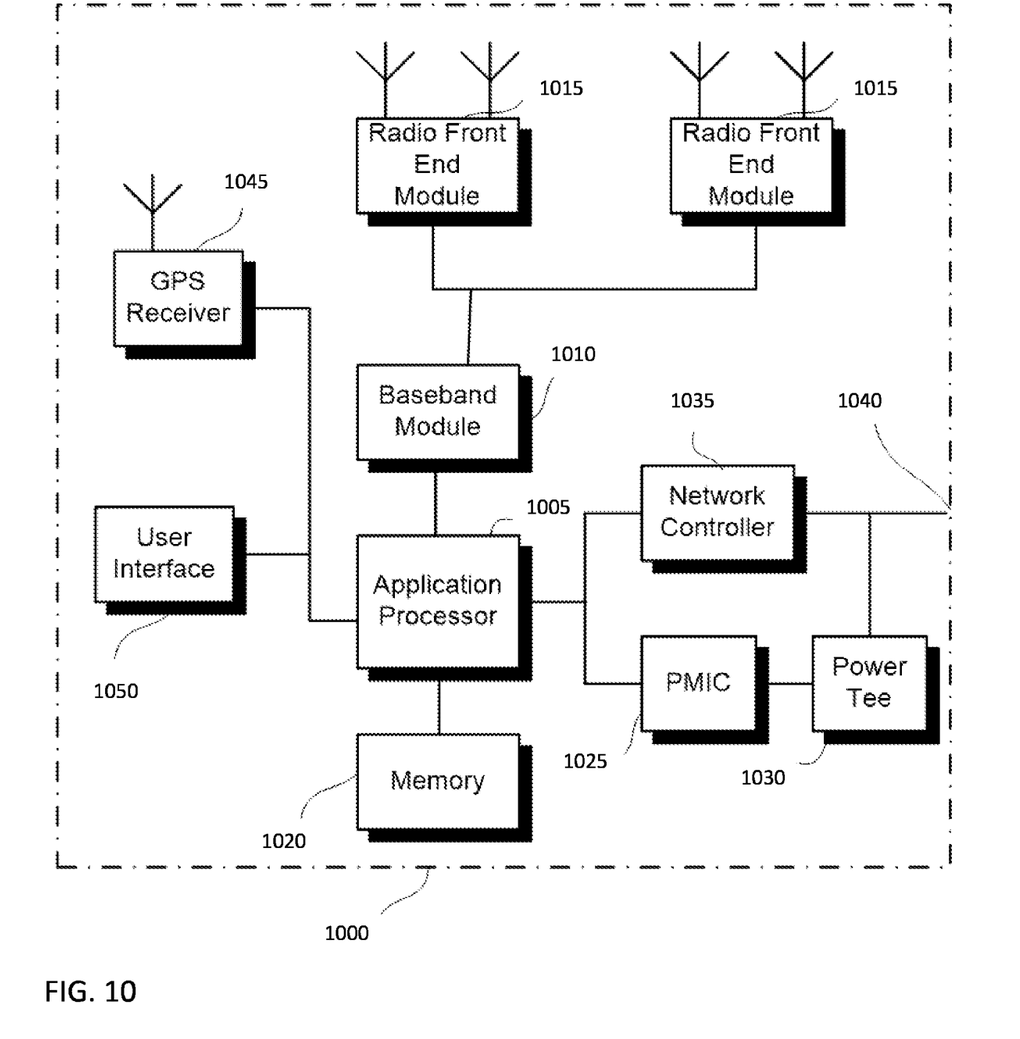
FIG. 10 illustrates a base station or infrastructure equipment radio head in which the examples disclosed herein may be implemented.

FIG. 10 illustrates a base station or infrastructure equipment radio head 1000 in which the examples disclosed herein may be implemented. For example, the examples disclosed herein may be implemented in the radio front-end module 1015, in the baseband module 1010, etc. The base station radio head 1000 may include one or more of application processor 1005, baseband modules 1010, one or more radio front end modules 1015, memory 1020, power management circuitry 1025, power tee circuitry 1030, network controller 1035, network interface connector 1040, satellite navigation receiver module 1045, and user interface 1050.

In some aspects, application processor 1005 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose TO, memory card controllers such as SD/MMC or similar, USB interfaces, MIPI interfaces and Joint Test Access Group (JTAG) test access ports.

In some aspects, baseband processor 1010 may be implemented, for example, as a solder-down substrate including one or more integrated circuits, a single packaged integrated circuit soldered to a main circuit board or a multi-chip module containing two or more integrated circuits.

In some aspects, memory 1020 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1020 may be implemented as one or more of solder down packaged integrated circuits, socketed memory modules and plug-in memory cards.

In some aspects, power management integrated circuitry 1025 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1030 may provide for electrical power drawn from a network cable to provide both power supply and data connectivity to the base station radio head 1000 using a single cable.

In some aspects, network controller 1035 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1045 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1045 may provide data to application processor 1005 which may include one or more of position data or time data. Application processor 1005 may use time data to synchronize operations with other radio base stations.

In some aspects, user interface 1050 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is a digital predistortion system for predistorting an input to a non-linear system. The system includes a digital predistortion circuit configured to receive input data and modify the input data using at least one look-up table, wherein the at least one look-up table is addressed by a signed real value of the input data, and a memory configured to store the at least one look-up table.

Example 2 is the DPD system of example 1, wherein the non-linear system is modeled as:

$$y(n) = \Sigma_{l=0}^{L-1} x(n-l) \Sigma_{m=0}^{M-1} P_{l,m}(x(n-l-m)),$$

where $P_{l,m}(x(n-l-m)) = \Sigma_{k=0}^{K-1} a_{lkm}(x(n-l-m))^k$. $x(n)$ is an input, $y(n)$ is an output, L is a memory depth, M is a cross-term, K is a non-linearity order, and $a_{lkm}$ is the model's coefficients, wherein $P_{on}$ is implemented with the at least one look-up table (322).

Example 3 is the DPD system as in any one of examples 1-2, wherein contents of the at least one look-up table is calculated directly.

Example 4 is the DPD system as in any one of examples 1-2, wherein contents of the at least one look-up table is calculated indirectly.

Example 5 is the DPD system as in any one of examples 1-4, wherein the non-linear system includes a power amplifier.

Example 6 is the DPD system as in any one of examples 1-5, wherein the non-linear system includes a digital-to-analog converter.

Example 7 is the DPD system as in any one of examples 1-6, wherein the digital predistortion circuit configured to dynamically update the at least one look-up table based on feedback from the non-linear system.

Example 8 is a transmitter including the DPD system as in any one of claims 1-7.

Example 9 is a base station including the transmitter of claim 8.

Example 10 is a user equipment including the transmitter of claim 8.

Example 11 is a method for pre-distorting an input to a non-linear system. The method includes receiving input data and modifying the input data using at least one look-up table wherein the at least one look-up table is addressed by a signed real value of the input data.

Example 12 is the method of example 11, wherein the non-linear system is modeled as:

$$y(n)=\Sigma_{l=0}^{L-1}x(n-l)\Sigma_{m=0}^{M-1}P_{l,m}(x(n-l-m)),$$

where $P_{l,m}(x(n-l-m))=\Sigma_{k=0}^{K-1}a_{lkm}(x(n-l-m))^k$. $x(n)$ is an input, $y(n)$ is an output, L is a memory depth, M is a cross-term, K is a non-linearity order, and $a_{lkm}$ is the model's coefficients, wherein $P_{l,m}$ is implemented with the at least one look-up table.

Example 13 is the method as in any one of examples 11-12, wherein contents of the at least one look-up table is calculated directly.

Example 14 is the method as in any one of examples 11-12, wherein contents of the at least one look-up table is calculated indirectly.

Example 15 is the method as in any one of examples 11-14, wherein the non-linear system includes a power amplifier.

Example 16 is the method as in any one of examples 11-15, wherein the non-linear system includes a digital-to-analog converter.

Example 17 is the method as in any one of examples 11-16, further comprising dynamically updating the at least one look-up table based on feedback from the non-linear system.

Example 18 is a machine-readable storage including machine readable instructions, when executed, to implement a method as in any one of claims 11-17.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A digital predistortion (DPD) system for pre-distorting an input to a non-linear system, comprising:
   a digital predistortion circuit configured to receive input data and modify the input data using at least one look-up table, wherein the at least one look-up table is addressed by a signed real value of the input data, wherein the signed real value of the input data ranges from a negative value to a positive value; and
   a memory configured to store the at least one look-up table.

2. The DPD system of claim 1, wherein the non-linear system is modeled as:

$$y(n)=\Sigma_{l=0}^{L-1}x(n-l)\Sigma_{m=0}^{M-1}P_{l,m}(x(n-l-m)),$$

where $P_{l,m}(x(n-l-m))=\Sigma_{k=0}^{K-1}a_{lkm}(x(n-l-m))^k$, x(n) is an input, y(n) is an output, L is a memory depth, M is a cross-term, K is a non-linearity order, and $a_{lkm}$ is the model's coefficients, wherein $P_{l,m}$ is implemented with the at least one look-up table.

3. The DPD system of claim 1, wherein contents of the at least one look-up table is calculated directly.

4. The DPD system of claim 1, wherein contents of the at least one look-up table is calculated indirectly.

5. The DPD system of claim 1, wherein the non-linear system includes a power amplifier and/or a digital-to-analog converter.

6. The DPD system of claim 1, wherein the digital predistortion circuit configured to dynamically update the at least one look-up table based on feedback from the non-linear system.

7. A transmitter including the DPD system of claim 1.

8. A base station including the transmitter of claim 7.

9. A method for pre-distorting an input to a non-linear system, comprising:
   receiving input data; and
   modifying the input data using at least one look-up table wherein the at least one look-up table is addressed by a signed real value of the input data, wherein the signed real value of the input data ranges from a negative value to a positive value.

10. The method of claim 9, wherein the non-linear system is modeled as:

$$y(n)=\Sigma_{l=0}^{L-1}x(n-l)\Sigma_{m=0}^{M-1}P_{l,m}(x(n-l-m)),$$

where $P_{l,m}(x(n-l-m))=\Sigma_{k=0}^{K-1}a_{lkm}(x(n-l-m))^k$, x(n) is an input, y(n) is an output, L is a memory depth, M is a cross-term, K is a non-linearity order, and $a_{lkm}$ is the model's coefficients, wherein $P_{l,m}$ is implemented with the at least one look-up table.

11. The method of claim 9, wherein contents of the at least one look-up table is calculated directly.

12. The method of claim 9, wherein contents of the at least one look-up table is calculated indirectly.

13. The method of claim 9, wherein the non-linear system includes a power amplifier and/or a digital-to-analog converter.

14. The method of claim 9, further comprising dynamically updating the at least one look-up table based on feedback from the non-linear system.

15. A non-transitory machine-readable storage including machine readable instructions, when executed, to implement a method of claim 9.

* * * * *

UNITED STATES PATENT AND TRADEMARK OFFICE
CERTIFICATE OF CORRECTION

PATENT NO. : 11,658,672 B2
APPLICATION NO. : 17/455223
DATED : May 23, 2023
INVENTOR(S) : Ramon Sanchez and Kameran Azadet It is certified that error appears in the above-identified patent and that said Letters Patent is hereby corrected as shown below:

In the Specification

Equation (1) in Lines 9-10 in Column 5 of the description shown as
"$f(x) - f(-x) = \sum_{k=0}^{\infty} a_k x^k - \sum_{k=0}^{\infty} a_k (-1)^k x^k = \sum_{k=0}^{\infty} a_{2k+1} x^{2k+1} = (\sum_{k=0}^{\infty} a_{2k+1} x^{2k}) \cdot x = g(x^2) \cdot x$"
should read
--$f(x) - f(-x) = \sum_{k=0}^{\infty} a_k x^k - \sum_{k=0}^{\infty} a_k (-1)^k x^k = \sum_{k=0}^{\infty} a_{2k+1} x^{2k+1} = (\sum_{k=0}^{\infty} a_{2k+1} x^{2k}) \cdot x = g(x^2) \cdot x$--

Equation (2) in Line 27 in Column 5 of the description shown as
"$y(n) = \sum_{l=0}^{L-1} \sum_{m=0}^{M-1} \sum_{k=0}^{K-1} a_{lkm} x(n-l) |x(n-l-m)|^k$" should read
--$y(n) = \sum_{l=0}^{L-1} \sum_{m=0}^{M-1} \sum_{k=0}^{K-1} a_{lkm} x(n-l) |x(n-l-m)|^k$--

Equation (3) in Line 41 in Column 5 of the description shows as
"$y(n) = \sum_{l=0}^{L-1} x(n-l) \sum_{m=0}^{M-1} \sum_{k=0}^{K-1} a_{lkm} |x(n-l-m)|^k$" should read
--$y(n) = \sum_{l=0}^{L-1} x(n-l) \sum_{m=0}^{M-1} \sum_{k=0}^{K-1} a_{lkm} |x(n-l-m)|^k$--

Equation (4) in Line 43 in Column 5 of the description shows as
"$y(n) = \sum_{l=0}^{L-1} x(n-l) \sum_{m=0}^{M-1} P_{l,m}(|x(n-l-m)|)$" should read
--$y(n) = \sum_{l=0}^{L-1} x(n-l) \sum_{m=0}^{M-1} P_{l,m}(|x(n-l-m)|)$--

Equation (5) in Lines 56-57 in Column 5 of the description shown as
"$f_p(x) - f_n(-x) = \sum_{k=0}^{\infty} a_{p,k} x^k - \sum_{k=0}^{\infty} a_{n,k} (-1)^k x^k = \sum_{k=0}^{\infty} b_k x^k = h(x) \cdot x$" should read
--$f_p(x) - f_n(-x) = \sum_{k=0}^{\infty} a_{p,k} x^k - \sum_{k=0}^{\infty} a_{n,k} (-1)^k x^k = \sum_{k=0}^{\infty} b_k x^k = h(x) \cdot x$--

Equation (6) in Line 63 in Column 5 of the description shown as
"$y(n) = \sum_{l=0}^{L-1} x(n-l) \sum_{m=0}^{M-1} P_{l,m}(x(n-l-m))$" should read
--$y(n) = \sum_{l=0}^{L-1} x(n-l) \sum_{m=0}^{M-1} P_{l,m}(x(n-l-m))$--

Signed and Sealed this
Third Day of September, 2024

Katherine Kelly Vidal
*Director of the United States Patent and Trademark Office*

CERTIFICATE OF CORRECTION (continued)
U.S. Pat. No. 11,658,672 B2

Equation in Line 1 in Column 6 of the description shown as
"$P_{l,m}(x(n-l-m)) = \sum_{k=0}^{K-1} a_{lkm}(x(n-l-m))^k$" should read
-- $P_{l,m}(x(n-l-m)) = \sum_{k=0}^{K-1} a_{lkm}(x(n-l-m))^k$ --

Equation in Line 40 in Column 8 of the description shown as
"$y(n) = \sum_{l=0}^{L-1} x(n-l) \sum_{m=0}^{M-1} P_{l,m}(x(n-l-m))$" should read
-- $y(n) = \sum_{l=0}^{L-1} x(n-l) \sum_{m=0}^{M-1} P_{l,m}(x(n-l-m))$ --

Equation in Line 41 in Column 8 of the description shown as
"$P_{l,m}(x(n-l-m)) = \sum_{k=0}^{K-1} a_{lkm}(x(n-l-m))^k$" should read
-- $P_{l,m}(x(n-l-m)) = \sum_{k=0}^{K-1} a_{lkm}(x(n-l-m))^k$ --

Equation in Line 9 in Column 9 of the description shown as
"$y(n) = \sum_{l=0}^{L-1} x(n-l) \sum_{m=0}^{M-1} P_{l,m}(x(n-l-m))$" should read
-- $y(n) = \sum_{l=0}^{L-1} x(n-l) \sum_{m=0}^{M-1} P_{l,m}(x(n-l-m))$ --

Equation in Line 10 in Column 9 of the description shown as
"$P_{l,m}(x(n-l-m)) = \sum_{k=0}^{K-1} a_{lkm}(x(n-l-m))^k$" should read
-- $P_{l,m}(x(n-l-m)) = \sum_{k=0}^{K-1} a_{lkm}(x(n-l-m))^k$ --

In the Claims

The equation in the third Line of Claim 2 shown as
"$y(n) = \sum_{l=0}^{L-1} x(n-l) \sum_{m=0}^{M-1} P_{l,m}(x(n-l-m))$" should read
-- $y(n) \sum_{l=0}^{L-1} x(n-l) \sum_{m=0}^{M-1} P_{l,m}(x(n-l-m))$ --

The equation in the fourth Line of Claim 2 shown as
"$P_{l,m}(x(n-l-m)) = \sum_{k=0}^{K-1} a_{lkm}(x(n-l-m))^k$" should read
-- $P_{l,m}(x(n-l-m)) = \sum_{k=0}^{K-1} a_{lkm}(x(n-l-m))^k$ --

The equation in the third Line of Claim 10 shown as
"$y(n) = \sum_{l=0}^{L-1} x(n-l) \sum_{m=0}^{M-1} P_{l,m}(x(n-l-m))$" should read
-- $y(n) = \sum_{l=0}^{L-1} x(n-l) \sum_{m=0}^{M-1} P_{l,m}(x(n-l-m))$ --

The equation in the fourth Line of Claim 10 shown as
"$P_{l,m}(x(n-l-m)) = \sum_{k=0}^{K-1} a_{lkm}(x(n-l-m))^k$" should read
-- $P_{l,m}(x(n-l-m)) = \sum_{k=0}^{K-1} a_{lkm}(x(n-l-m))^k$ --